US007576017B2

(12) United States Patent
Tuttle (10) Patent No.: US 7,576,017 B2
(45) Date of Patent: Aug. 18, 2009

(54) METHOD AND APPARATUS FOR FORMING A THIN-FILM SOLAR CELL USING A CONTINUOUS PROCESS

(75) Inventor: John R. Tuttle, Mechanicville, NY (US)

(73) Assignee: DayStar Technologies, Inc., Halfmoon, NY (US)

( * ) Notice: Subject to any disclaimer, the term of this patent is extended or adjusted under 35 U.S.C. 154(b) by 251 days.

(21) Appl. No.: 11/271,583

(22) Filed: Nov. 10, 2005

(65) Prior Publication Data

US 2006/0096537 A1    May 11, 2006

Related U.S. Application Data

(60) Provisional application No. 60/626,843, filed on Nov. 10, 2004.

(51) Int. Cl.
H01L 21/00 (2006.01)
C23C 16/00 (2006.01)
(52) U.S. Cl. .................. 438/800; 118/719; 118/723 VE
(58) Field of Classification Search ........... 118/723 VE; 438/800
See application file for complete search history.

(56) References Cited

U.S. PATENT DOCUMENTS

| 4,392,451 | A | * | 7/1983 | Mickelsen et al. .......... 118/690 |
| 4,576,830 | A | | 3/1986 | Kiss |
| 4,663,829 | A | | 5/1987 | Hartman et al. |
| 4,851,095 | A | | 7/1989 | Scobey |
| 5,258,075 | A | * | 11/1993 | Kurokawa .................... 118/719 |
| 5,343,012 | A | | 8/1994 | Hardy |
| 5,366,554 | A | * | 11/1994 | Kanai et al. ................. 118/719 |
| 5,411,592 | A | | 5/1995 | Ovshinsky et al. |
| 5,470,784 | A | | 11/1995 | Coleman |
| 5,474,611 | A | * | 12/1995 | Murayama et al. ..... 118/723 VE |
| 5,849,162 | A | | 12/1998 | Bartolomei |
| 6,270,861 | B1 | | 8/2001 | Mashburn |
| 6,288,325 | B1 | | 9/2001 | Jansen et al. |
| 6,323,417 | B1 | | 11/2001 | Gillespie et al. |
| 6,554,950 | B2 | | 4/2003 | van Mast |
| 6,881,647 | B2 | | 4/2005 | Stanbery |
| 2004/0063320 | A1 | | 4/2004 | Hollars |
| 2005/0056863 | A1 | | 3/2005 | Negami et al. |

OTHER PUBLICATIONS

K. Ramanathan, F.S. Hasoon, S. Smith, D.L. Young and M.A. Contreras, P.K. Johnson, A.O. Pudov and J.R. Sites, "Surface Treatment of CuInGaSe$_2$ Thin Films and its Effect on the Photovoltaic Properties of Solar Cells", Presented at the 13th ICTMC, held Oct. 14-18, 2002.

(Continued)

Primary Examiner—Lex Malsawma
(74) Attorney, Agent, or Firm—Hiscock & Barclay, LLP (57) ABSTRACT

The present invention relates to new methods for manufacturing photovoltaic devices and an apparatus for practicing those methods of manufacture. The present invention employs a transfer-through system for advancing work piece substrates through an integrated apparatus of multiple treatment chambers that control each of the manufacturing processes.

44 Claims, 6 Drawing Sheets

OTHER PUBLICATIONS

Dominik Rudmann, "Effects of Sodium on Growth and Properties of Cu(In,Ga)Se$_2$ Thin Films and Solar Cells", A dissertation submitted to the Swiss Federal Institute of Technology (Eth) Zürich, 2004.

Marika Bodeg Ard, Karin Granath and Lars Stolt, "Growth of Cu(In,Ga) Se$_2$ Thin Films by Coevaporation Using Alkaline Precursors", *Thin Solid Films*, 2000, pp. 9-16, vol. 361-362, Elsevier Science S.A.

A. Rocket, "The Effect of Na in Polycrystalline and Epitaxial Single-Crystal CuIn$_{1-x}$Ga$_x$Se$_2$", *Thin Solid Films*, 2005, pp. 2-7, vol. 480-481, Elsevier Science S.A.

D. Rudmann, D. Brémaud, A.F. da Cunha, G. Bilger, A. Strohm, M. Kaelin, H. Zogg and A.N. Tiwari, "Sodium Incorporation Strategies for CIGS Growth at Different Temperatures", *Thin Solid Films*, 2004, pp. 55-60, vol. 480-481, Elsevier Science S.A.

Tokio Nakada, Hiroki Ohbo, Masakazu Fukuda and Akio Kunioka, "Improved Compositional Flexibility of Cu(In,Ga)Se$_2$—Based Thin Film Solar Cells by Sodium Control Technique", *Solar Energy Materials and Solar Cells*, 1997, pp. 261-267, vol. 49, Elsevier Science B.V.

V. Probst, J. Rimmasch, W. Riedly, W. Stetter, J. Holz, H. Harms and F. Karg, "The Impact of Controlled Sodium Incorporation on Rapid Thermal Processed Cu(InGa)Se$_2$—Thin Films and Devices", First WCPEC, Dec. 5-9, 1994, Hawaii.

M. Ruckh, D. Schmid, M. Kaiser, R. Schäffler, T. Walter and H.W. Schock, "Influence of Substrates on the Electrical Properties of Cu(InGa)Se$_2$ Thin Films", First WCPEC, Dec. 5-9, 1994, Hawaii.

Miguel A. Contreras, B. Egaas, P. Dippo, J. Webb, J. Granata, K. Ramanathan, S. Asher, A. Swartzlander and R. Noufi, "On the Role of Na and Modifications to Cu(InGa)Se$_2$ Absorber Materials Using Thin-MF (M=Na, K, Cs) Precursor Layers" 26th PVSC, Sep. 30-Oct. 3, 1997, Anaheim, CA.

J.R. Tuttle et al., "Investigations into Alternative Substrate, Absorber, and Buffer Layer Processing for Cu(In,Ga)Se2-Based Solar Cells", 25th PVSC, May 13-17, 1996. pp. 797-800.

T. Nakada et al., "Superstrate-Type CuInSe2 Thin Film Solar Cells with Selenide Buffer Layers", 25th PVSC, May 13-17, 1996. pp. 893-896.

A. Kampmann et al., "A Cadmium-free CuInSe2 Superstrate Solar Cell Fabricated by Electrodeposition Using a ITO/In2Se3/CuInSe2/Au Structure", Prog. Photovolt. Res. Appl. 7, 129-135. (1999).

* cited by examiner

METHOD AND APPARATUS FOR FORMING A THIN-FILM SOLAR CELL USING A CONTINUOUS PROCESS

CROSS-REFERENCE TO RELATED APPLICATIONS

This application claims priority from U.S. Provisional Patent Application Ser. No. 60/626,843, filed Nov. 10, 2004.

BACKGROUND OF THE INVENTION

The invention disclosed herein relates generally to the field of photovoltaics and more specifically to manufacturing thin-film solar cells using a continuous process and thin film solar cells made according to the process.

DESCRIPTION OF THE RELATED ART

Photovoltaic (PV) cells, modules and power systems offer clean, reliable, renewable energy to the world's expanding demand for electrical power. Unfortunately, product costs have not been sufficiently reduced to open up the critical markets in the developing world where electricity demand is driving them to polluting, non-renewable sources such as coal and oil. With the population expanding, and per-capita energy consumption going up, the world is heading towards an irreconcilable future where energy demand and supply irreversibly diverge.

PV cells offer an alternative to non-renewable energy sources. However, although relatively efficient PV cells can be manufactured in the laboratory, it has proven difficult to scale into commercial scale processes with consistent repeatability and efficiency critical for commercial viability. The lack of an efficient thin-film manufacturing process has contributed to the failure of PV cells to effectively replace alternate energy sources in the market.

Currently, cells are manufactured using a multi-step batch process wherein each product piece is transferred between reaction steps and such transfer is bulky and requires reaction in chambers to be cycled. A typical process consists of a series of individual batch processing chambers each specifically designed for the formation of various layers in the cell. One drawback to this process is that the substrate is transferred from vacuum to air and back to vacuum several times. An alternate system uses a series of individual batch processing chambers coupled with a roll-to-roll continuous process for each chamber. The major drawback in this process is the discontinuity of the system and the need to break vacuum.

Using approaches as outlined above, one or more defects can render the entire plate (a single device) useless and result in zero yield for that unit of product. These and other problems have relegated thin-film technologies to less than 10% market share worldwide.

SUMMARY OF THE INVENTION

The present invention provides a photovoltaic produced by providing a substrate mounted to a pallet through a series of reaction chambers where sequentially a barrier layer, a back contact layer, an semiconductor layer or layers, an n-type junction buffer layer, an intrinsic transparent oxide layer, a transparent conducting oxide layer and a top metal grid can be formed on the pallet.

In an alternate embodiment of the invention, a thin-film solar cell is formed using a continuous manufacturing process. In this embodiment, a flexible and continuous substrate is processed through a reactor having a plurality of process zones disposed along a continuous path between an entrance and exit of the reactor. Each process zone within the reactor is defined by a predetermined processing environment and is dedicated to one step layer of device formation. Each zone may further comprise processing conditions in conjunction with one or more deposition methodologies.

A method is further disclosed for forming a photovoltaic device in a continuous fashion. In this embodiment, a continuous substrate is passed at a defined rate through a reactor having a plurality of processing zones, wherein each zone is dedicated to one production step stage of device manufacture. These production steps include: 1.) A load or isolation zone for substrate preparation; 2.) an environment for depositing a barrier layer; 3.) an environment for depositing a back contact layer; 4.) an environment for deposition of a semiconductor layer; 5.) an environment for depositing alkali materials; 6.) an environment for depositing another semiconductor layer or layers; 7.) an environment for the thermal treatment of one or more of the previous layers; 8.) an environment for the deposition of an n-type semiconductor layer wherein this layer serves as a junction buffer layer; 9.) an environment for deposition of an intrinsic transparent oxide layer; and 10.) an environment for deposition of a conducting transparent oxide layer. In a further embodiment, the process may be adjusted to comprise fewer zones in order to fabricate a thin film solar cell having fewer layers, or additional processing can be added as well.

It is also understood that additional zones may be employed to isolate deposition or treatment zones from one another to prevent chemical cross-contamination and to allow optimal recovery. These isolation zones can range in the duration the work piece resides therein in order to allow the exposed substrate to reach an optimal condition for the next production step in a vacuum seal to prevent cross-contamination.

Depending upon the specific photovoltaic design, one or more zones within the reactor may be adjusted. For example, one or more zones comprising compatible deposition environments may be combined. Alternatively, a zone may comprise a combination of deposition processes enabling varying deposition environments or sub-zones.

In a further embodiment, one or more layers may be combined into a single layer and deposited in a single zone. For example, the semiconductor layer and the alkali materials may be combined to form an alkali containing mixed phase semiconductor source layer.

To clarify, each drawing includes reference numerals. These reference numerals follow a common nomenclature. The reference numerals will have three or four digits. The first one or two digits represent the drawing number where the reference numeral was first used. For example, a reference numeral used first in drawing one will have a number like 1XX while a number first used in drawing five will have a number like 5XX. The second two numbers represent a specific item within a drawing. One item in FIG. 1 will be 101 while another item will be 102. Like reference numerals used in later drawing represent the same item.

DETAILED DESCRIPTION OF THE INVENTION

Figure 1:
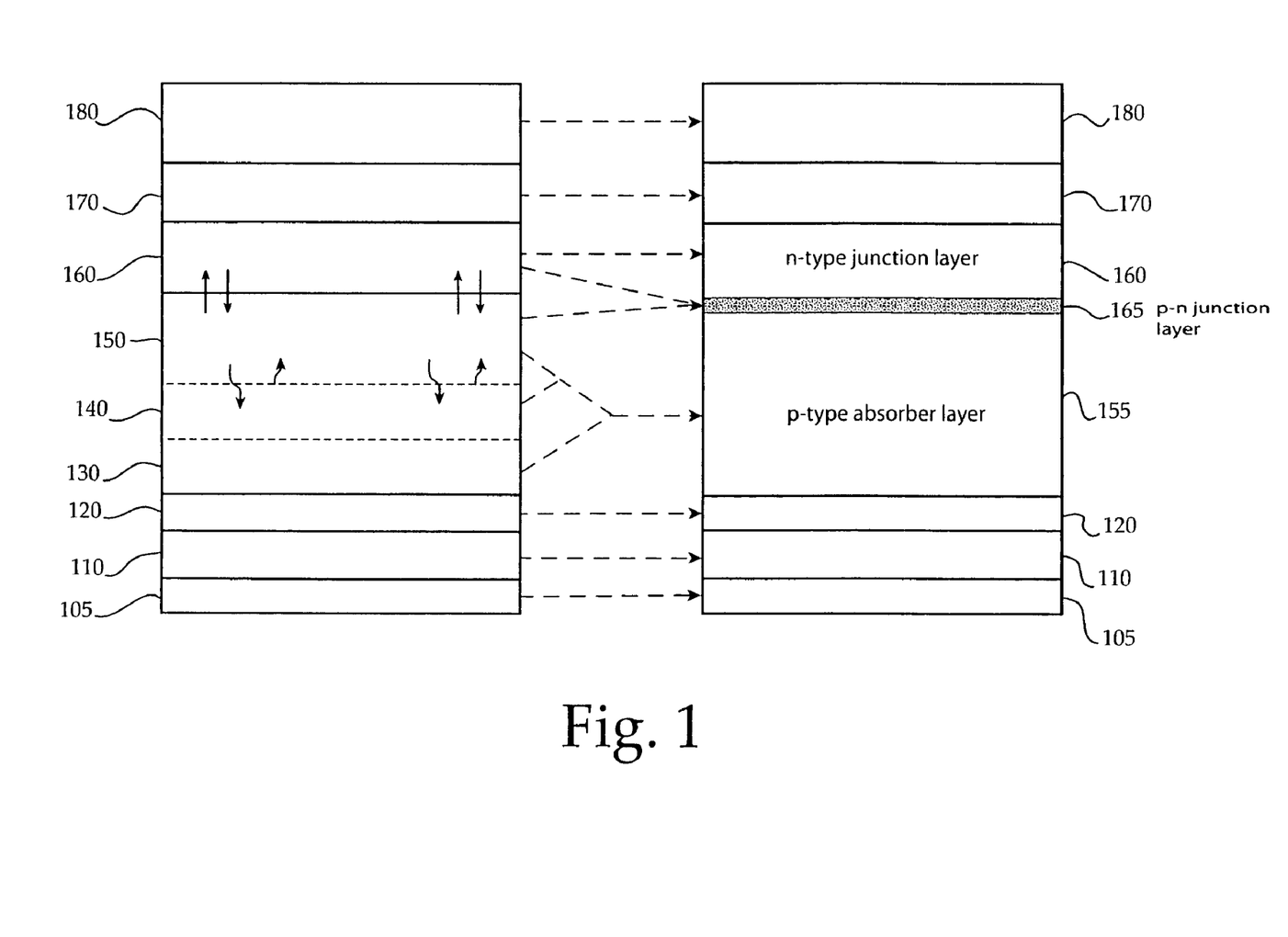
FIG. 1 shows an embodiment of a thin-film solar cell produced by the production technology of the present invention.

The present invention employs a new production apparatus in order to produce photovoltaic devices. The particular apparatus will depend upon the specific photovoltaic device design, which can be varied. FIG. 1 shows a photovoltaic device or thin-film solar cell 100 comprising a substrate 105, a barrier layer 110, a back contact layer 120, a semiconductor layer 130, alkali materials 140, another semiconductor layer 150, an n-type junction buffer layer 160, an intrinsic transparent oxide layer 170, and a transparent conducting oxide layer 180. It will be recognized by one skilled in the art that the thin film solar cell may comprise fewer layers and still function according to the invention. For instance, the device need not have alkali-materials.

Two variations of an integrated production apparatus are provided. In each case, a series of treatment chambers are provided, where each chamber provides a specific treatment regimen in order to produce a specific layer deposition or layer treatment. Each of these treatment chambers allow a means to transport the work piece being made into the photovoltaic device to be transported from the first designed chamber, through the sequential plurality of chambers, until the work piece has been made into the designed photovoltaic stack.

This plurality of reaction or treatment chambers provided with a transport mechanism may also include one or more isolation chambers that insure that particularly effective reactants are maintained in specifically desired chambers and do not contaminate downstream processes. Of course this isolation system is particularly important in the formation of the semiconductor layers of the photovoltaic device where relatively small amounts of material determine whether a layer is a p-type or n-type semiconductor. This carrier may be configured with referencing means to insure that the positioning of the work pieces are positioned within the production apparatus at defined positions.

The invention envisions two types of transport mechanisms for transporting work pieces through the apparatus. The first is a continuous roll system where a relatively flexible substrate is run through the system and collected. After finishing the stack the substrate may be cut into smaller pieces or, if the photovoltaic stack design permits, it may be collected on a finished roll.

The second approach is to provide a plurality of work piece substrates onto a device capable of fixturing the substrates onto a carrier that also has means that allow the pieces to be advanced in a precise fashion through the production apparatus.

Viewing FIG. 1, all layers are deposited on a substrate 105 which may comprise one of a plurality of functional materials, for example, glass, metal, ceramic, or plastic. Deposited directly on the substrate 105 is a barrier layer 110. The barrier layer 110 comprises a thin conductor or very thin insulating material and serves to block the out diffusion of undesirable elements or compounds from the substrate to the rest of the cell. This barrier layer 110 may comprise chromium, titanium, silicon oxide, titanium nitride and related materials that have the requisite conductivity and durability. The next deposited layer is the back contact layer 120 comprising non-reactive metals such as molybdenum. The next layer is deposited upon the back contact layer 120 and is a p-type semiconductor layer 130 to improve adhesion between an absorber layer and the back contact layer 120. The p-type semiconductor layer 130 may be a $III_{a,b}$-VI isotype semiconductor, but the preferred composition is Cu:Ga:Se, Cu:Al:Se, or Cu:In:Se alloyed with either of the previous compounds.

In this embodiment, the formation of a p-type absorber layer involves the interdiffusion of a number of discrete layers. Ultimately, as seen in FIG. 1, the p-type semiconductor layers 130 and 150 combine into a single composite layer 155 which serves as the prime absorber of solar energy. In this embodiment, alkali materials 140 are added for the purpose of seeding the growth of subsequent layers as well as increasing the carrier concentration and grain size of the absorber layer 155, thereby increasing the conversion efficiency of the solar cell.

The alkali materials 140 are commonly sodium based and is usually deposited in the form of Na-VII (VII=F, Cl, Br) or $Na_2$-VI (VI=S, Se, Te). When deposited, the alkali materials 140 may be in the form of a Na-A:I-III-VI alloy (A=VI or VII) to allow for exchange of elements with the semiconductor layer 150.

As shown by FIG. 1, the alkali material is discrete, and the semiconductor layer 150 is deposited upon it. However, the alkali materials do not stay discrete, but rather are absorbed by the semiconductor layer 150 as part of the formation of the final p-type absorber layer as shown in 155. When deposited, the alkali materials are deposited onto the p-type semiconductor layer 130 or other preexisting layer through evaporation, sputtering, or other deposition methods known to those skilled in the art. In the preferred embodiment, the alkali material 140 is sputtered at ambient temperature and at a mild vacuum, preferably $10^{-6}$-$10^{-2}$ torr. Once deposited, the layers are thermally treated at a temperature of about 400° C.-600° C.

After the thermal treatment, the photovoltaic production process is continued by the deposition of an n-type junction buffer layer 160. This layer 160 will ultimately interact with the absorber layer 155 to form the necessary p-n junction 165. A transparent intrinsic oxide layer 170 is deposited next to serve as a hetero-junction with the CIGS absorber. Finally, a conducting transparent oxide layer 180 is deposited to function as the top of the electrode of the cell. This final layer is conductive and may carry current to a grid carrier that allows the current generated to be carried away.

Figure 2:
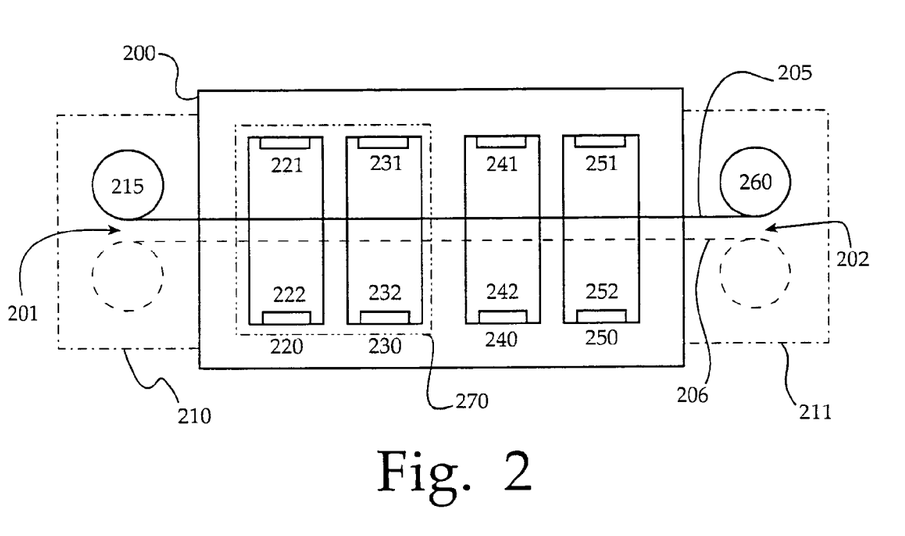
FIG. 2 shows an embodiment of a continuous process for manufacturing a thin-film solar cell in accordance with the present invention.

FIG. 2 schematically represents a reactor 200 for forming solar cells. A substrate 205 is fed left to right through the reactor via a feed roll 215 and a take up roll 260. The reactor 200 includes one or more processing zones, referred to in FIG. 2 as 220, 230, 240 and 250, wherein each processing zone comprises an environment for depositing materials on a substrate 205. The zones are mechanically or operatively linked together within the reactor 200. As used herein, the term environment refers to a profile of conditions for depositing or reacting a material layer or mixture of materials on the substrate 205 while the substrate 205 is in a particular zone.

Each zone is configured according to which layer of the solar cell is being processed. For example, a zone may be configured to perform a sputtering operation, including heat sources and one or more source targets.

Preferably, an elongated substrate 205 is passed through the various processing zones at a controllable rate. It is further contemplated that the substrate 205 may have a translational speed of 0.5 m/min to about 2 m/min. Accordingly, the process internal to each of the zones is preferably tuned to form the desired cross-section given the residence time the material is proximate to a particular source material, given the desired transport speed. Thus, the characteristics of each process, such as material and process choice, temperature, pressure, or sputtering delivery rate, etc., may be chosen to insure that constituent materials are properly delivered given the stack's residence time as determined by the transport or translation speed.

Figure 3:
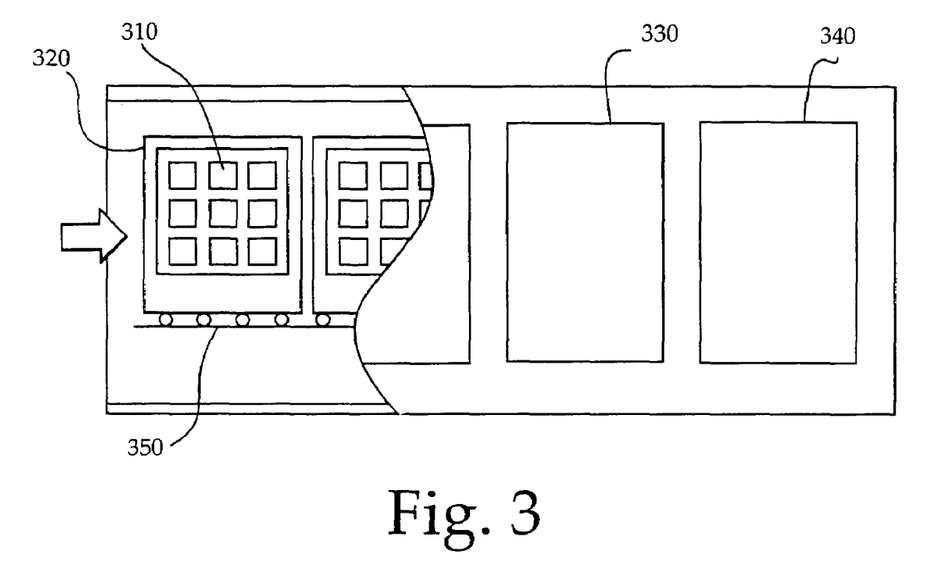
FIG. 3 illustrates one embodiment of a substrate being fed from left to right through a continuous process in accordance with the present invention.

According to the invention, the substrate 205 may be transported through the process in a continuous roll fashion, or in a palletized fashion in a "picture frame" type mount for indexing and transportation through the process, the latter of which is illustrated in FIG. 3. Referring to FIG. 3 one substrate or group of substrates 310 are mounted on a pallet 320 that translates through one or more zones 330 and 340 on track 350. In alternate embodiments the process may further comprise a second substrate or set of substrates placed in a back to back configuration with substrate 310.

It is contemplated that the background pressure within the various zones will range from $10^{-6}$ torr to $10^{-3}$ torr. Pressures above base-vacuum ($10^{-6}$ torr) may be achieved by the addition of a pure gas such as Argon, Nitrogen or Oxygen. Preferably, the rate R is constant resulting in the substrate 205 passing through the reactor 200 from entrance 201 to exit 202 without stopping. It will be appreciated by those of ordinary skill in the art that a solar cell stack may thus be formed in a continuous fashion on the substrate 205, without the need for the substrate 205 to ever stop within the reactor 200.

The reactor in FIG. 2 may further comprise vacuum isolation sub-zones or slit valves configured to isolate adjacent process zones. The vacuum isolation sub-zones or slit valves are provided to facilitate the continuous transport of the substrate between different pressure environments.

The reactor 200 shown in FIG. 2 is a plurality of N-processing zones 220, 230, 240 and 250. However, it should be recognized by one skilled in the art that the reactor may comprise zones 220, 230, 240, 250 . . . N zones. The load/unload zones 210/211 comprise zones that can be isolated from the rest of the reactor and can be open to atmosphere.

According to the invention, the solar cell described above comprising ten layers may be manufactured using a reactor comprising ten zones, wherein each zone comprises an environment for deposition of that particular layer. In various embodiments however, various zones may be combined thereby decreasing the total number of zones contained within the reactor 200.

FIG. 2 shows that each zone may comprise a discrete environment for deposition of a particular layer, in various embodiments; two zones 220, 230 may be combined into one zone 270 as indicated by the dashed line to combine multiple process aspects. There may be any variation in the number of zones contained within the reactor depending on the desired structure of the solar cell. In this embodiment, substrate 205 runs through zones 220, 230, 240 and 250 performing process operations 221, 231, 241 and 251 respectively.

In a preferred embodiment, the process may further comprise a substrate 215 that runs back-to-back with substrate 205. In this embodiment, substrates 215 and 205 are oriented vertically in a back-to-back configuration and run through zones 220, 230, 240 and 250 performing identical process operations 222, 232, 242 and 252.

Figure 4:
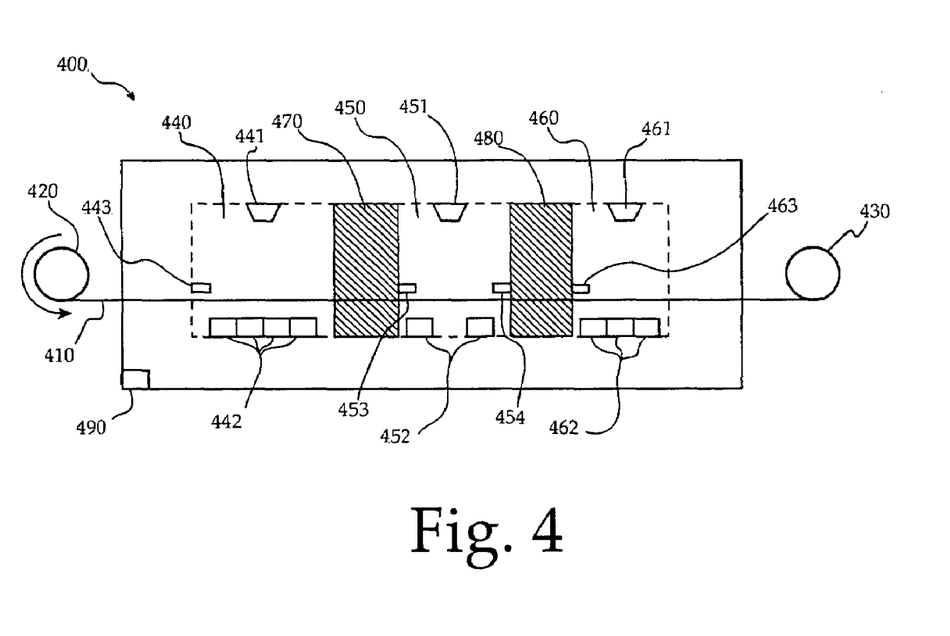
FIG. 4 illustrates one embodiment of a continuous process in accordance with the invention.

FIG. 4 shows a substrate 410 being fed from left to right through the reactor 400 via feed roll 420 and take-up roll 430. In this example, the reactor comprises three process zones: 440, 450 and 460. In the reactor 400, zone 440 is configured to perform a sputtering operation; including heat sources 441, and one or more source targets 442. Likewise, zone 460 is configured to perform a sputtering operation, including nozzle 461 and targets 462. Zone 450 is configured to perform a sputtering operation, including nozzle 451 and targets 452. Zone 450 is configured to perform a thermal evaporation process.

FIG. 4 schematically shows vacuum isolation zones 470 and 480 configured to isolate adjacent process zones. The vacuum isolation zones are provided to facilitate the continuous transportation of the substrate between different pressure environments. Specifically, isolation zones would be useful between chambers used to deposit selenium.

The reactor 400, shown in FIG. 4, includes a pumping system for creating a pressure lower than the lowest process pressure. The sputtering zones may have a pressure of $10^{-3}$ torr, and the thermal zone may have a pressure of $10^{-6}$ torr. In this example, the isolation zones may have a pressure of $10^{-7}$ torr in order to provide an effective low pressure barrier.

The lower pressure of the isolation zone is configured to minimize conduction flow between zones, thus providing a relatively stable environment in the adjacent process zones. The orifice through which the material moves is preferably marginally larger than the thickness of the substrate in order to minimize gas flow into the isolation chamber while still maintaining work piece flow.

The length of the isolation zones may be determined by several factors: the internal pressure environment of adjacent zones, residence time of the work piece in the chamber, sensitivity of the work process to cross-contamination between reactor zone, and the like.

The reactor illustrated in FIG. 4 preferably includes a microprocessor, associated memory 490, and sensors for controlling the operation of the disclosed process. The microprocessor 490 may comprise a computer as is known in the art for storing, retrieving, and executing computer instructions relating to the operation of the process machine, or alternatively may be a more modest industrial controller sufficient to monitor and control a limited, pre-determined set of process variables.

The computer 490 may be operatively coupled to various sensors in each zone to receive feedback corresponding to various aspects of the process and adjust desired parameters in response to received feedback. For example, the reactor 400 may include sensors 443 disposed in zone 440, sensor 453 disposed in zone 450, and sensor 463 disposed in zone 460. One or more sensors may be disposed in the various zones to provide computer 490 desired environmental feedback. These sensors may monitor such variables as vapor pressure, vapor content, temperature, translation speed of the work piece, physical characteristics of the surface, and the like.

The temperature and pressure of a given zone may be sensed, as well as the environmental conditions in a given region or sub-zone of a zone. For example, additional sensor 454 may be provided to sense conditions in a particular sub-zone of zone 450 than that sensed by sensor 453. In this manner, a multiple of environments may be provided within a zone. For example, the sensors may be configured to provide differing temperature profiles within the same zone.

Additionally, other aspects of the disclosed process may be sensed and controlled in a dynamic fashion. For example tension sensors may be deployed through the process to dynamically maintain a desired tension on the substrate. As a particular portion of the substrate moves downstream through the process, it may be subjected to temperature variations. This will naturally cause the substrate to expand and contract in reaction to the changing temperature. To ensure that the substrate is maintained at a constant tension, sensors may provide feedback to the computer, and the computer may be configured to control the feed and take up rolls or other feeding mechanisms in response to the sensed feedback. Parameters such as temperature or sputtering power may be dynamically sensed and/or adjusted to maintain a desired tension.

Still further, it is contemplated that the substrate may be configured to enable the tension to be precisely controlled. For example, a portion of the substrate proximate to one or both edges may be intentionally left bare to facilitate rollers guides, tension controls, or other feed mechanisms to directly contact and thus control the tension of the substrate. Alternatively, tractor feed guide holes, such as those commonly found in paper or film may be disposed about the substrate to facilitate transportation and tension control.

These mechanical tension control methods may be used in conjunction with environmental sensors to more accurately control the tension of the substrate as it is passed from one environment to the next.

Figure 6A:
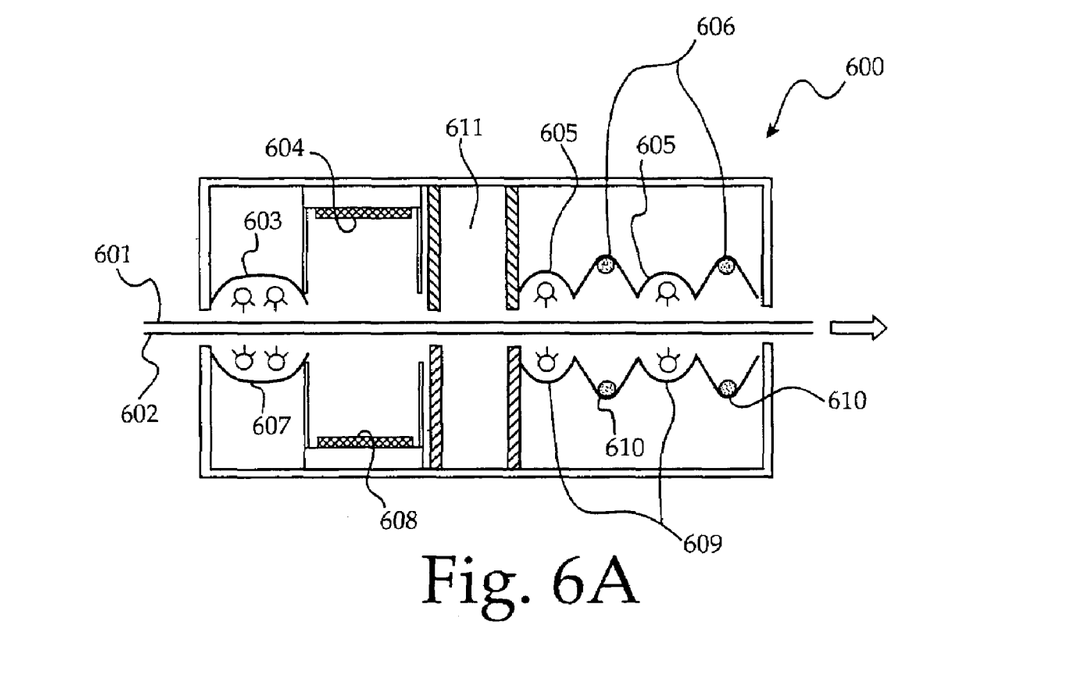
FIG. 6A shows an embodiment of the processing method wherein two substrates are fed and processed simultaneously by a sequential sputter-evaporate process in accordance with the present invention.

FIG. 6A shows a top illustration of a portion of a reactor 600 processing substrates 601 and 602 in a back-to-back fashion and also illustrates a sequential sputter-evaporate process isolated by zone 611. To achieve back-to-back processing, heat sources 603 for substrate 601 are mirrored as heat sources 607 for substrate 602. Likewise, sputtering source 604, heat sources 605, and evaporative sources 606 for substrate 601 are mirrored for substrate 602 as sputtering source 607, heat sources 609, and evaporative sources 610.

Figure 6B:
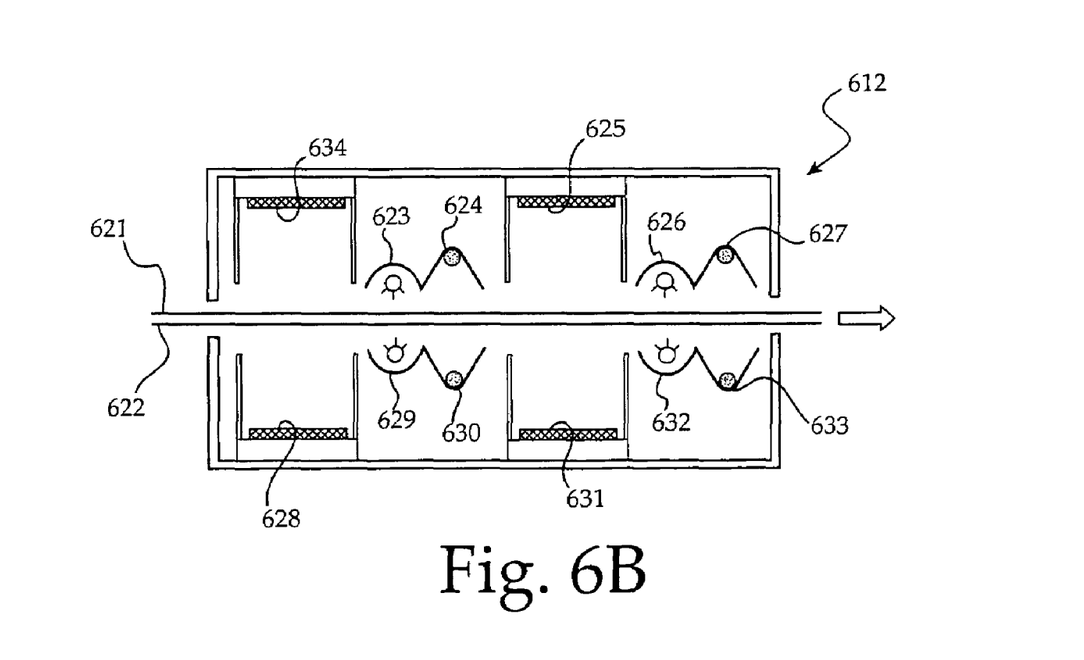
FIG. 6B shows a top view of an embodiment of the processing method wherein two substrates are fed and processed simultaneously by a sequential sputter-evaporate/sputter-evaporate process.

FIG. 6B shows a top illustration of a portion of a reactor 620 processing substrates 621 and 622 in a back-to-back fashion with a sequential sputter-evaporate/sputter-evaporate process. As in FIG. 6A, sputter sources 622 for substrate 621 are mirrored as sputter sources 628 for substrate 622. Likewise, heat sources 623 and 626, evaporative sources 624 and 627, and sputtering source 625 for substrate 621 are mirrored for substrate 622 as heat sources 629 and 632, evaporative sources 629 and 633, and sputtering source 631. Hence, with the simple duplication of heat and material sources, solar cell production may be effectively doubled within the same machine.

Specific Processing Steps

Turning now to the individual process steps, the process begins by loading a substrate through an isolated loading zone or like unit 210. In various embodiments, the isolation zone 210 is contained within the reactor 200. Alternatively, the isolation zone 210 may be attached to the outer portion of the reactor 200. The first processing zone 210 may further comprise a substrate preparation environment to remove any residual imperfections at the atomic level of the surface. The substrate preparation may include: ion beam, deposition, heating or sputter-etching.

A second processing zone may be an environment for depositing a barrier layer for substrate impurity isolation, wherein the barrier layer provides an electrically conductive path between the substrate and subsequent layers. In a preferred embodiment, the barrier layer comprises an element such as chromium or titanium delivered by a sputtering process. Preferably, the environment comprises a pressure in the range of about $10^{-3}$ torr to about $10^{-2}$ torr at ambient temperature.

A third processing zone downstream from the previous zones comprises an environment for the deposition of a metallic layer to serve as a back contact layer. The back contact layer comprises a thickness that provides a conductive path for electrical current. In addition, the back contact layer serves as the first conducting layer of the solar cell stack. The layer may further serve to prevent the diffusion of chemical compounds such as impurities from the substrate to the remainder of the solar cell structure or as a thermal expansion buffer between the substrate layer and the remainder of the solar cell structure. Preferably, the back contact layer comprises molybdenum, however, the back contact layer may comprise other conductive metals such as aluminum, copper or silver.

A fourth zone provides an environment for deposition of a p-type semiconductor layer. The p-type semiconductor layer may serve as an epitaxial template for absorber growth. Preferably, the p-type semiconductor layer is an isotype I-IIIVI$_2$ material, wherein the optical band gap of this material is higher than the average optical band gap of the p-type absorber layer. For example, a semiconductor layer may comprise Cu:Ga:Se, Cu:Al:Se, or alloys of Cu:In:Se with either of the previous compounds. Preferably, the materials are delivered by a sputtering process at a background pressure of $10^{-6}$ to $10^{-2}$ torr and at temperatures ranging from ambient up to about 300° C. More preferably, temperatures range from ambient to about 200° C.

A fifth zone downstream from the previous zones provides an environment for the deposition of a alkali materials to enhance the growth and the electrical performance of the type absorber. Preferably, the seed layer is sputtered, at ambient temperature and a pressure range of about $10^{-6}$ torr to $10^{-2}$ torr. Preferably, the material comprises NaF, Na$_2$Se, Na$_2$S or KCl or like compounds wherein the thickness ranges from about 50 nm to about 500 nm.

A sixth zone downstream from the previous zones may comprise an environment for the deposition of additional semiconductor layers for the CIGS absorber layer. In a preferred embodiment, the sixth zone may further comprise one or more sub-zones for the deposition of the semiconductor layers. In one embodiment, the CIGS absorber layer is formed by first delivering precursor materials in one or more contiguous sub-zones, then reacting the precursor materials into the p-type absorber layer in a downstream thermal treatment zone. Thus, especially for CIGS systems, there may be two material deposition steps and a third thermal treatment step in the format of the layer.

In the precursor material delivery zones, the layer of precursor materials is deposited in a wide variety of ways, including evaporation, sputtering, and chemical vapor deposition or combinations thereof. Preferably, the precursor material may be delivered at temperatures ranging from about 200° C.-300° C. It is desired that the precursor materials react to form the p-type absorber as rapidly as possible. As previously discussed to this end, the precursor layer or layers may be formed as a mixture or a series of thin layers.

A manufacturing device may also have a seventh processing zone downstream from previous processing zones for the thermal treatment of one or more of the previous layers. The term multinaries includes binaries, ternaries, and the like. Preferably, thermal treatment reacts previously unreacted elements or multinaries. For example, in one embodiment it is preferred to have Cu, In, Se, and Ga in various combinations and ratios of multinary compounds of elements as the source for deposition on the work piece. The reactive environment includes selenium and sulfur in varying proportions and ranges in temperature from about 400° C. to about 600° C. with or without a background inert gas environment. In various embodiments, processing time may be minimized to one minute or less by optimizing mixing of the precursors. Optimal pressures within the environment depend on whether the environment is reactive or inert. According to the invention, within the thermal treatment zone, the pressures range from about $10^{-6}$ to about $10^{-1}$ torr. However, it should be noted that these ranges depend very much on the reactor design for the stage, the designer of the photovoltaic device, and the operational variables of the apparatus as a whole.

The reactor may have an eighth processing zone for the formation of an n-type semiconductor layer or junction partner. The junction buffer layer is selected from the family II-VI, or $III_x$ VI. For example, the junction buffer layer may comprise ZnO, ZnSe, ZnS, In, Se or InNS deposited by evaporation, sublimation, or chemical vapor deposition methodologies. The temperatures range from about 200° C. to about 400° C.

Additionally, the process may also have a ninth zone having an environment for deposition of an intrinsic layer of a transparent oxide, for example ZnO. According to the invention, the intrinsic transparent oxide layer may be deposited by a variety of methods including for example, RF sputtering, CVD, or MOCVD.

In various embodiments, the process may also have a tenth zone with an environment for the deposition of a transparent conductive oxide layer to serve as the top electrode for the solar cell. In one embodiment for example, aluminum doped ZnO is sputter deposited. Preferably, the environment comprises a temperature of about 200° C. and a pressure of about 5 millitorr. Alternatively, ITO (Indium Tin Oxide) or similar may be used.

In one embodiment, as described above, the reactor may comprise discrete zones wherein each zone corresponds to one layer of photovoltaic device formation. In a preferred embodiment however, zones comprising similar constituents and or environment conditions may be combined thereby reducing the total number of zones in the reactor.

Figure 5:
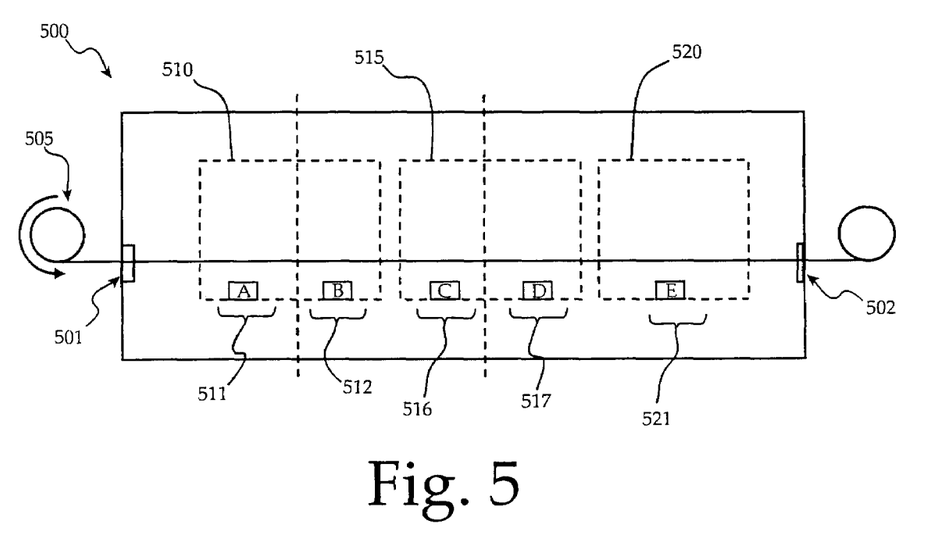
FIG. 5 illustrates another embodiment of a continuous process in accordance with the invention wherein zones further comprise one or more sub-zones.

For example, in FIG. 5, zone 510 comprises sub-zones 511 and 512, zone 515 comprises sub-zones 516 and 517, and zone 520 comprises one zone, wherein each zone and sub-zone comprises a predetermined environment. In this example, a material A may be deposited in sub-zone 511 and a different material B may be deposited in sub-zone 512, wherein the environment of sub-zone 512 downstream from material A differs from the environment in sub-zone 511. Thus, the substrate 505 may be subjected to a different temperature or other process profiles while in different regions of the same zone 510. According to this embodiment, the zone may be defined as having a predetermined pressure, and a zone may include one or more regions, sub-zones, or phases therein, with each sub-zone configured to deposit or react a desired material or materials within the same pressure environment.

The substrate 505 may then be passed to chamber 515, where material C is deposited within sub-zone 516, and material D is deposited in sub-zone 517. Finally, the substrate 505 reaches a zone 520, where a single material E is deposited.

As will be appreciated by those of ordinary skill in the art, the reactor 500 may be described as having a series of zones disposed between the entrance and exit of the reactor along a path defined by the translation of the substrate. Within each zone, one or more constituent environments or sub-zones may be provided to deposit or react a selected target material or materials, resulting in a continuous process for forming a solar cell stack. Once the substrate enters the reactor, the various layers of a solar stack are deposited and formed in a sequential fashion, with each downstream process in succession contributing to the formation of the solar cell stack until a finished thin film solar cell is presented at the exit of the reactor.

While embodiments and applications of this disclosure have been shown and described, it would be apparent to those skilled in the art that many more modifications and improvements than mentioned above are possible without departing from the inventive concepts herein. The disclosure, therefore, is not to be restricted except in the spirit of the appended claims.

What is claimed is:

1. An apparatus for manufacturing a photovoltaic device comprising a plurality of zones disposed in a treatment path including:
    a first zone for deposition of a conductive back layer;
    a second zone for deposition of a p-type semiconductor layer;
    a third zone for deposition alkali materials on the p-type semiconductor layer, the third zone being located downstream from the second zone;
    a fourth zone for deposition an n-type semiconductor layer;
    a fifth zone for deposition of a transparent conductive front layer; and
    a sixth zone for thermal treatment of the p-type semiconductor layer and the alkali materials, the sixth zone being located downstream from the second zone and the third zone.

2. The apparatus for manufacturing a photovoltaic device of claim 1 further comprising a means for providing in sequence a substrate to a plurality of reactor zones for preparing said substrate.

3. The apparatus for manufacturing a photovoltaic device of claim 1 further comprising a seventh zone for transition of a substrate from an ambient environment to the first zone.

4. The apparatus of claim 3 wherein the substrate transitions, in part or whole, from atmospheric pressure to reduced pressure consistent with the subsequent processing environment.

5. The apparatus for manufacturing a photovoltaic device of claim 1 further comprising a seventh zone for deposition of a barrier layer.

6. The apparatus of claim 5 wherein the seventh zone deposits a barrier layer comprising a thin conductor or very thin insulating material.

7. The apparatus for manufacturing a photovoltaic device of claim 1 further comprising a seventh zone for deposition of a second p-type semiconductor layer, the third zone being disposed between the second zone and the seventh zone.

8. The apparatus of claim 7 wherein the first zone deposits a conductive back contact layer, the conductive back contact layer comprising a metallic layer.

9. The apparatus of claim 8 wherein the metallic layer comprises conductive metals chosen from the group consisting of molybdenum, titanium, tantalum, and other acceptable metals or alloys.

10. The apparatus of claim 9 wherein the metallic layer is molybdenum.

11. The apparatus of claim 1, wherein the third zone deposits alkali materials selected from the group consisting of Na-VII or $Na_2$-VII.

12. The apparatus for manufacturing a photovoltaic device of claim 1 further comprising a seventh zone for deposition of a second p-type semiconductor layer.

13. The apparatus of claim 12 wherein the second semiconductor layer comprises Group I, III, VI elements.

14. The apparatus of claim 13 wherein the second semiconductor layer comprises $CuGaSe_2$, $CuAlSe_2$, or $CuInSe_2$ alloyed with one or more of the I, III, VI elements.

15. The apparatus of claim 14 wherein the second semiconductor layer comprises $CuGaSe_2$.

16. The apparatus for manufacturing a photovoltaic device of claim 1 further comprising a seventh zone for deposition of a second p-type semiconductor layer wherein the second semiconductor layer comprises precursor p-type absorber materials.

17. The apparatus of claim 16 wherein the precursor materials comprise Group I, III, VI elements.

18. The apparatus of claim 17 wherein the precursor materials comprise a I-(IIIa,IIIb)-$VI_2$ layer.

19. The apparatus of claim 18 wherein the precursor materials comprise one or more of the elements of a I-(IIIa,IIIb)-$VI_2$ layer where the 0.0<IIIb/(IIIa+IIIb) <0.4.

20. The apparatus of claim 18 wherein the precursor materials comprise one or more of the alloys of a I-(IIIa,IIIb)-$VI_2$ layer where the 0.0<IIIb/(IIIa +IIIb)<0.4.

21. The apparatus of claim 1 wherein the second zone deposits a p-type semiconductor layer comprising a CIGS absorber layer comprising $In_{1-x}$:$Ga_x$:$Se_2$ where x ranges between 0.2 to 0.3 wherein the thickness ranges from about 1 µm to about 3 µm.

22. The apparatus of claim 21 where the CIGS absorber layer is formed by the delivery of type I, III and VI precursor metals where Cu, $In_{1-x}$, $Ga_x$, and $Se_2$ layers are sequentially deposited on the substrate.

23. The apparatus of claim 21 where the CIGS absorber layer is formed by the delivery of the type I, III and VI precursor metals where Cu, $In_{1-x}$, $Ga_x$, and $Se_2$ layers are sequentially deposited on the substrate and then synthesized into an alloy mixture with a thermal treatment.

24. The apparatus of claim 21 where the CIGS absorber layer is formed by the delivery of type I, III and VI precursor metals where an Cu:$Ga_x$ layer is separately synthesized, and then co-deposited with an $In_{1-x}$ layer and $Se_2$ layer on a substrate.

25. The apparatus of claim 21 where the CIGS absorber layer is formed by the delivery of type I, III and VI precursor metals where a Cu:$Ga_x$ layer is separately synthesized, and then co-deposited with an $In_{1-x}$ layer and $Se_2$ layer on a substrate; and then synthesized into an alloy mixture with a thermal treatment.

26. The apparatus of claim 21 where the CIGS absorber layer is formed by the delivery of type I, III and VI precursor metals where an Cu:$Ga_x$:$In_{x-1}$ layer is separately synthesized, and then co-deposited with an $Se_2$ layer on a substrate.

27. The apparatus of claim 21 where the CIGS absorber layer includes a type I, III and VI precursor metals where a Cu:$Ga_x$:$In_{x-1}$ layer is separately synthesized, and then co-deposited with an $Se_2$ layer on a substrate; and then synthesized into an alloy mixture with a thermal treatment.

28. The apparatus of claim 1 wherein the sixth zone is configured to maintain a pressure range of $10^{-6}$ torr up to atmospheric pressure and a temperature range of 300° C. to 700° C.

29. The apparatus of claim 1 wherein the fourth zone deposits a discrete n-type semiconductor layer.

30. The apparatus of claim 1 wherein the fourth zone deposits a discrete layer that comprises one or more of Group II-VI, Ill-VI elements.

31. The apparatus of claim 1 wherein the fourth zone deposits a discrete layer comprising one or more of the following materials chosen from the group consisting of (In,Ga)$_y$(Se,S,O) and (Zn,Cd) (Se,S,O).

32. The apparatus of claim 1 wherein the fourth zone deposits a discrete layer comprising one or more of the following materials chosen from the group consisting of (In,Ga)$_2Se_3$, (In,Ga)$_2S_3$, ZnSe, ZnS, and ZnO.

33. The apparatus of claim 1 wherein the fourth zone deposits a discrete n-type semiconductor layer formed by diffusion of a dopant species into a p-type absorber layer.

34. The apparatus of claim 33 wherein the dopant species is chosen from the group consisting of one or more Group II or III elements.

35. The apparatus of claim 34 wherein the dopant species comprises either Zn or Cd.

36. The apparatus for manufacturing a photovoltaic device of claim 1 further comprising a seventh zone for deposition of an insulating transparent semiconductor layer.

37. The apparatus of claim 36 wherein the seventh zone deposits the insulating transparent semiconductor layer that comprises one or more materials from Group II-VI or II-IV-VI.

38. The apparatus of claim 36 wherein the seventh zone deposits the insulating transparent semiconductor layer that comprises one or more materials ZnO or ITO.

39. The apparatus for manufacturing a photovoltaic device of claim 1 further comprising a seventh zone for deposition of a conducting transparent semiconductor layer.

40. The apparatus of claim 39 wherein the seventh zone deposits the conducting transparent semiconductor layer that comprises one or more materials from Group II-VI or II-IV-VI.

41. The apparatus of claim 39 wherein the seventh zone deposits the conducting transparent semiconductor layer that comprises one or more materials selected from the group consisting of ZnO, $Cd_2SnO_4$ and ITO.

42. The apparatus for manufacturing a photovoltaic device of claim 1 further comprising a seventh zone for transition of a substrate from the sixth zone back to the ambient environment.

43. The apparatus of claim 42 wherein the substrate transitions, in part or whole, from atmospheric pressure to the reduced pressure consistent with the subsequent processing environment.

44. An apparatus for manufacturing a photovoltaic device comprising:
a first zone for transition of a substrate from an ambient environment to the processing environment, wherein the substrate transitions, in part or whole, from atmospheric pressure to reduced pressure consistent with the subsequent processing environment;
a second zone for deposition of a conductive back layer, wherein the deposition of a conductive back contact layer comprises a metallic layer comprised of molybdenum;
a third zone for deposition of a barrier layer wherein the barrier layer comprises a thin conductor or very thin insulating material;
a fourth zone for deposition of a first semiconductor layer wherein the semiconductor layer comprises $CuGaSe_2$, $CuAlSe_2$, or $CuInSe_2$ alloyed with one or more of the I, III, VI elements;

a fifth zone for deposition of alkali materials, wherein the alkali materials are Na-VII or Na$_2$-VII;

a sixth zone for deposition of a second semiconductor layer wherein the semiconductor layer comprises a I-(IIIa, IIIb)-VI$_2$ layer, the fifth zone being located between the fourth zone and the sixth zone;

a seventh zone for thermal treatment of one or more layers thus forming a p-type absorber layer wherein the treatment occurs in the pressure range of $10^{-6}$ torr up to atmospheric pressure and temperature range of 300° C. to 700° C., the thermal treatment zone being located downstream from the sixth zone;

a eighth zone for deposition an n-type semiconductor layer wherein the n- type semiconductor layer comprises one or more of the following group (In,Ga)$_y$(Se,S,O) or the following group (Zn,Cd) (Se,S,O);

a ninth zone for deposition of a transparent conductive front layer wherein the insulating transparent semiconductor layer comprises one or more materials ZuG or ITO; and a tenth zone for deposition of a conducting transparent semiconductor layer, wherein the conducting transparent semiconductor layer comprises one or more materials ZnO, Cd$_2$SnO$_4$ or ITO.

* * * * *

UNITED STATES PATENT AND TRADEMARK OFFICE
CERTIFICATE OF CORRECTION

PATENT NO. : 7,576,017 B2  Page 1 of 1
APPLICATION NO. : 11/271583
DATED : August 18, 2009
INVENTOR(S) : John R. Tuttle It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 512 days.

Signed and Sealed this

Seventh Day of September, 2010

David J. Kappos
*Director of the United States Patent and Trademark Office*